US006943457B2

(12) United States Patent
Smith

(10) Patent No.: US 6,943,457 B2
(45) Date of Patent: *Sep. 13, 2005

(54) SEMICONDUCTOR PACKAGE HAVING POLYMER MEMBERS CONFIGURED TO PROVIDE SELECTED PACKAGE CHARACTERISTICS

(75) Inventor: Steven R. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/662,698

(22) Filed: Sep. 15, 2003

(65) Prior Publication Data

US 2004/0065945 A1 Apr. 8, 2004

Related U.S. Application Data

(60) Continuation of application No. 10/210,926, filed on Aug. 2, 2002, now Pat. No. 6,700,210, which is a continuation of application No. 09/841,221, filed on Apr. 25, 2001, now Pat. No. 6,440,772, which is a division of application No. 09/454,503, filed on Dec. 6, 1999, now Pat. No. 6,384,487.

(51) Int. Cl.⁷ .............................................. H01L 23/29
(52) U.S. Cl. ........................ 257/790; 257/666; 257/784
(58) Field of Search ................................. 257/790, 787, 257/666, 783, 781, 784; 438/106, 111, 112, 123–124, 727

(56) References Cited

U.S. PATENT DOCUMENTS

| | | |
|---|---|---|
| 3,706,840 A | 12/1972 | Moyle et al. |
| 3,721,868 A | 3/1973 | Smith, Jr. |
| 3,778,685 A * | 12/1973 | Kennedy .................... 257/735 |
| 4,026,008 A | 5/1977 | Drees |
| 4,250,347 A * | 2/1981 | Fierkens .................... 174/52.2 |
| 4,540,603 A | 9/1985 | Hidaka et al. |
| 4,788,583 A | 11/1988 | Kawahara et al. |
| 4,994,411 A | 2/1991 | Naito |

(Continued)

OTHER PUBLICATIONS

Book of Semi Standards 1995, Packaging Volume, Specification Dimensions and Tolerances Used to Manufacture Plastic Molded Small Outline Package Tooling, SEMI 1995 pp. 175–178.
"Analysis of Warpage of LSI package". Copy Right Nitto Denko, 1999.
Lee Choon Kuan et al. "IC Package Warpage—Prediction and Control", TI Singapore, MOS Memory Package Development Dept., date unknown.
1994 Dram Data Book, Micron Semiconductor, Inc., Packaging Plastic TSOP, p. 7–19, 1994.

*Primary Examiner*—Hoai Pham
*Assistant Examiner*—Dilinh Nguyen
(74) *Attorney, Agent, or Firm*—Stephen A. Gratton

(57) ABSTRACT

A bow resistant semiconductor package includes a semiconductor die, a leadframe and a plastic body. The plastic body includes a molded inner member encapsulating the die, and a molded outer member encapsulating the molded inner member. The inner member rigidities the package, and is dimensioned such that the outer member has substantially equal volumes of molding compound on either side of the leadframe. The equal volumes of molding compound reduce thermo-mechanical stresses generated during cooling of the molding compound, and reduce package bow. With reduced package bow, a planarity of the terminal leads on the package is maintained. Also, stresses on bonded connections between the terminal leads and electrodes on a supporting substrate, such as a printed circuit board or multi chip module substrate are reduced. In an alternate embodiment, the package includes volume equalizing members formed on the leadframe configured to equalize the volumes of molding compound on upper and lower segments of the package body.

23 Claims, 6 Drawing Sheets

U.S. PATENT DOCUMENTS

| | | |
|---|---|---|
| 5,057,457 A | 10/1991 | Miyahara et al. |
| 5,097,317 A | 3/1992 | Fujimoto et al. |
| 5,147,815 A | 9/1992 | Casto |
| 5,157,478 A * | 10/1992 | Ueda et al. .................. 257/796 |
| 5,197,183 A | 3/1993 | Chia et al. |
| 5,206,794 A | 4/1993 | Long |
| 5,291,059 A | 3/1994 | Ishisuka et al. |
| 5,365,107 A | 11/1994 | Kuraishi et al. |
| 5,394,014 A * | 2/1995 | Ishikawa et al. ............ 257/790 |
| 5,437,915 A | 8/1995 | Nishimura et al. |
| 5,442,231 A | 8/1995 | Miyamoto et al. |
| 5,619,065 A | 4/1997 | Kim |
| 5,637,915 A | 6/1997 | Sato et al. |
| 5,638,596 A | 6/1997 | McCormick |
| 5,659,198 A | 8/1997 | Okutomo et al. |
| 5,674,785 A | 10/1997 | Akram et al. |
| 5,739,585 A | 4/1998 | Akram et al. |
| 5,750,423 A | 5/1998 | Ishii |
| 5,767,570 A | 6/1998 | Rostoker |
| 5,770,479 A | 6/1998 | Brooks et al. |
| 5,793,118 A | 8/1998 | Nakajima |
| 5,869,355 A | 2/1999 | Fukaya |
| 5,920,114 A | 7/1999 | Beaumont |
| 5,970,320 A | 10/1999 | Yamasaki et al. |
| 5,970,322 A | 10/1999 | Ichikawa et al. |
| 5,981,315 A | 11/1999 | Murakami et al. |
| 5,989,940 A | 11/1999 | Nakajima |
| 5,998,866 A | 12/1999 | Ochi et al. |
| 6,025,212 A | 2/2000 | VanNortwick et al. |
| 6,028,368 A | 2/2000 | Abe |
| RE36,613 E | 3/2000 | Ball |
| 6,043,430 A | 3/2000 | Chun |
| 6,048,755 A | 4/2000 | Jiang et al. |
| 6,063,139 A | 5/2000 | Fukaya |
| 6,068,180 A | 5/2000 | Test |
| 6,091,157 A | 7/2000 | Black et al. |
| 6,093,958 A * | 7/2000 | Inaba ........................ 257/672 |
| 6,153,924 A | 11/2000 | Kinsman |
| 6,229,202 B1 | 5/2001 | Corisis |
| 6,258,624 B1 | 7/2001 | Corisis |
| 6,271,056 B1 | 8/2001 | Farnworth et al. |
| 6,281,044 B1 | 8/2001 | VanNortwick |
| 6,700,210 B1 | 3/2004 | Smith |

\* cited by examiner

SEMICONDUCTOR PACKAGE HAVING POLYMER MEMBERS CONFIGURED TO PROVIDE SELECTED PACKAGE CHARACTERISTICS

CROSS REFERENCE TO RELATED APPLICATIONS

This application is a continuation of Ser. No. 10/210,926, filed Aug. 2, 2002, U.S. Pat. No. 6,700,210 B1, which is a continuation of Ser. No. 09/841,221, filed Apr. 25, 2001, U.S. Pat. No. 6,440,772 B1, which is a division of Ser. No. 09/454,503, filed Dec. 6, 1999, U.S. Pat. No. 6,384,487 B1.

FIELD OF THE INVENTION

This invention relates generally to semiconductor packaging and specifically to a method for fabricating plastic semiconductor packages with reduced package bow.

BACKGROUND OF THE INVENTION

A conventional plastic semiconductor package includes a semiconductor die encapsulated in a molded plastic body. The molded plastic body rigidifies and protects the die from the environment. A plastic semiconductor package also includes a metal leadframe wire bonded to bond pads on the die. An adhesive member, such as polyimide tape, or alternately an adhesive layer on the lead frame, attaches the die to the leadframe. The leadframe forms terminal leads for the package and provides internal signal, power and ground paths through the package body to the die.

One aspect of a plastic semiconductor package is that the molded plastic body, the die, the leadframe and the adhesive tape comprise different materials, having different coefficients of thermal expansion (CTE). Because of the different coefficients of thermal expansion, thermo-mechanical stresses are generated within the package as the package is subjected to a temperature change. These stresses are particularly large during manufacture, as the package body cools from a relatively high molding temperature (e.g., 183° C.) to room temperature (e.g., 25° C.).

One problem that results from these thermo-mechanical stresses is referred to as "package bow" or "package warpage". FIGS. 1A–1C illustrate different types of package bow, or warpage, in plastic semiconductor packages. In FIG. 1A, a semiconductor package 10A includes a plastic body 12A and a plurality of terminal leads 14A extending from the body 12A on opposed longitudinal sides thereof. The package 10A has undergone a negative bow and has the profile of a "frown". Specifically, the package body 12A has bowed with respect to a theoretical flat profile FP by a warp distance X, which by convention is designated (−). In addition, some of the terminal leads 14A at the center of the package 10A are offset from a theoretical planar reference plane RP by an offset distance of Y.

In FIG. 1B, a semiconductor package 10B includes a package body 12B which has undergone a positive bow, and has the profile of a "smile". Specifically, the package body 12B has bowed with respect to the theoretical flat profile FP by the warp distance X, which by convention is designated (+). In addition, some of the terminal leads 14B at the ends of the package 10B are offset from the theoretical planar reference plane RP by the offset distance Y.

In FIG. 1C, a semiconductor package 10C includes a package body 12C which has undergone both negative and positive warp distances X, and has an "undulating" profile. In addition, some of the terminal leads 14C in the center of the package 10C, as well as some of the terminal leads 14C at an end of the package 10C, are offset from the theoretical reference plane RP by the offset distance Y.

In each of the packages 10A, 10B, 10C the package bow has been illustrated as occurring along a longitudinal axis of the package. However, package bow can occur along any axis (e.g., lateral axis, diagonal axis) of the package 10A, 10B, 10C. Still further, package bow can be evaluated at any point on the package 10A, 10B, 10C. For example, one method for evaluating package bow is to measure the warp distance X at many different points on a major surface (e.g., top surface or bottom surface) of the package 10A, 10B, 10C. These measurements can be made using a surface laser profiler, a surface roughness meter, or with other conventional instruments known in the art.

Package bow can also be defined by a "warp factor". SEMI (Semiconductor Equipment and Materials International) defines the warp factor as the warp distance X in mils divided by the length of the package in inches (i.e., WF=X(mils)/L(inches). SEMI standards (SEMI G37-88) for plastic molded small outline packages specify an acceptable warp factor as being 2.5 or less. SEMI standards (SEMI G37-88) also define package warpage as any non-linear dimensional change from the mold cavity characteristic.

One problem resulting from package bow is that the terminal leads 14A, 14B, 14C of the package are no longer coplanar. without co-planar terminal leads 14A, 14B, 14C, surface mounting of the package 10A, 10B, 10C to a supporting substrate, such as a circuit board, can be difficult. SEMI standards (SEMI G37-88) for plastic molded small outline packages specify that lead co-planarity, measured in a vertical direction, must be within 3 mils (i.e., Y<3 mils). For making planarity measurements, the reference plane RP can be defined by the three lowest terminal leads 14A, 14B, 14C from the bottom of the package 10A, 10B, 10C. In addition to affecting lead planarity, in lead on chip packages (LOC), package bow can adversely affect the planarity of the leadfingers on the leadframe, and the adhesive bonds to the die.

Also with package bow, once the package is surface mounted to the supporting substrate, additional stresses are generated at the soldered connections between the terminal leads 14A, 14B, 14C and the supporting substrate. These stresses can cause solder joint failure, and can decrease the lifetime of the package 10A, 10B, 10C. Package bow can also cause problems during handling of the packages 10A, 10B, 10C by automated pick and place equipment, which requires planar surfaces for suction cups to operate properly.

Package bow is particularly troublesome in thin packages, such as thin small outline packages (TSOP). In addition, package bow has become more of a problem due to decreases in the thicknesses of semiconductor dice. Conventional semiconductor dice, for example, have recently decreased in thickness from about 28 mils to about 14 mils. The thinner dice are more likely to bow in a package, and are less likely to provide a rigidifying structure in the package capable of resisting thermo-mechanical stresses.

In view of the foregoing, improved plastic semiconductor packages able to resist bowing, and improved methods for fabricating plastic semiconductor package with reduced bowing, are needed in the art.

SUMMARY OF THE INVENTION

In accordance with the present invention, a bow resistant plastic semiconductor package is provided. Also provided are a method for fabricating plastic semiconductor packages with reduced package bow, and improved electronic assemblies fabricated using the plastic semiconductor package.

The plastic semiconductor package includes a die, a lead frame attached to the die, and a plastic body encapsulating the die and the lead frame. In an illustrative embodiment, the package has the configuration of a thin small outline package (TSOP) having terminal leads in a gull wing configuration. Also in the illustrative embodiment, the lead frame and the die have a LOC (lead-on-chip) configuration, and an adhesive member attaches the die to lead fingers on the lead frame. In addition, wire bonds are formed between bond pads on the die, and the lead fingers on the leadframe, to provide electrical paths therebetween.

The plastic body includes a molded inner member that encapsulates the die, the wire bonds, and portions of the lead fingers proximate to the die. The plastic body also includes a molded outer member, that encapsulates the inner member, and portions of the lead fingers proximate to the terminal leads. The molded inner member provides additional structural strength and rigidity for the package. In addition, the molded inner member is dimensioned to equalize the volume of molding compound in the molded outer member on either side of the leadframe. Stated differently, the molded outer member comprises substantially equal volumes of molding compound on either side of a package parting line.

With the molded outer member comprising substantially equal volumes of molding compound, the magnitude of thermo-mechanical stresses developed as the molding compound undergoes shrinkage during cooling are decreased. The package body is therefore less likely to bow, and cause the terminal leads and the lead fingers to become non-planar. Further, the molded inner member can be at least partially cured prior to molding of the outer member, such that the package body has an internal rigidity for resisting package bow during cooling of the outer member. The molded inner member can also be configured to provide increased structural rigidity for surface mounting the package in electronic assemblies.

The package fabrication method can be performed using a two stage encapsulation process including: a first encapsulation stage for molding the inner member over the die and first portions of the lead fingers, and a second encapsulation stage for molding the outer member over the inner member and second portions of the lead fingers. The two stage encapsulation process can be performed using separate mold cavities having required geometries, and using the same molding compound for each stage. In addition, the inner member can be at least partially cured prior to molding of the outer member on the inner member.

In an alternate embodiment package, the inner member does not encapsulate the die, but comprises one or more volume equalizing members attached to the lead frame, and encapsulated in the plastic body. The volume equalizing members can comprise an electrically insulating material such as a molding compound, glob top material, or polymer tape. In addition to providing structural strength and rigidity for the package, the volume equalizing members are dimensioned to equalize the volume of molding compound above and below the package parting line.

The bow resistant package improves the construction of electronic assemblies such as printed circuit boards, and multi chip modules. In particular, stresses on bonded connections between the package leads and electrodes on a substrate of the assembly are substantially eliminated due to the planarity of the package leads.

DETAILED DESCRIPTION OF THE PREFERRED EMBODIMENTS

Referring to FIGS. 2A–2E, a plastic semiconductor package 16 constructed in accordance with the invention is illustrated.

In the illustrative embodiment, the package 16 has the configuration of a thin small outline package (TSOP). However, the package 16 can be fabricated with any other conventional configuration including DIP (dual in line package), ZIP (zig zag in line package), PLCC (plastic leadless carrier), SOP (small outline package), SOJ (small outline j-bend), PQFP (plastic quad flat package), BGA (ball grid array package), PGA (pin grid array package), or LGA (land grid array package).

Figures 2A, 2B:
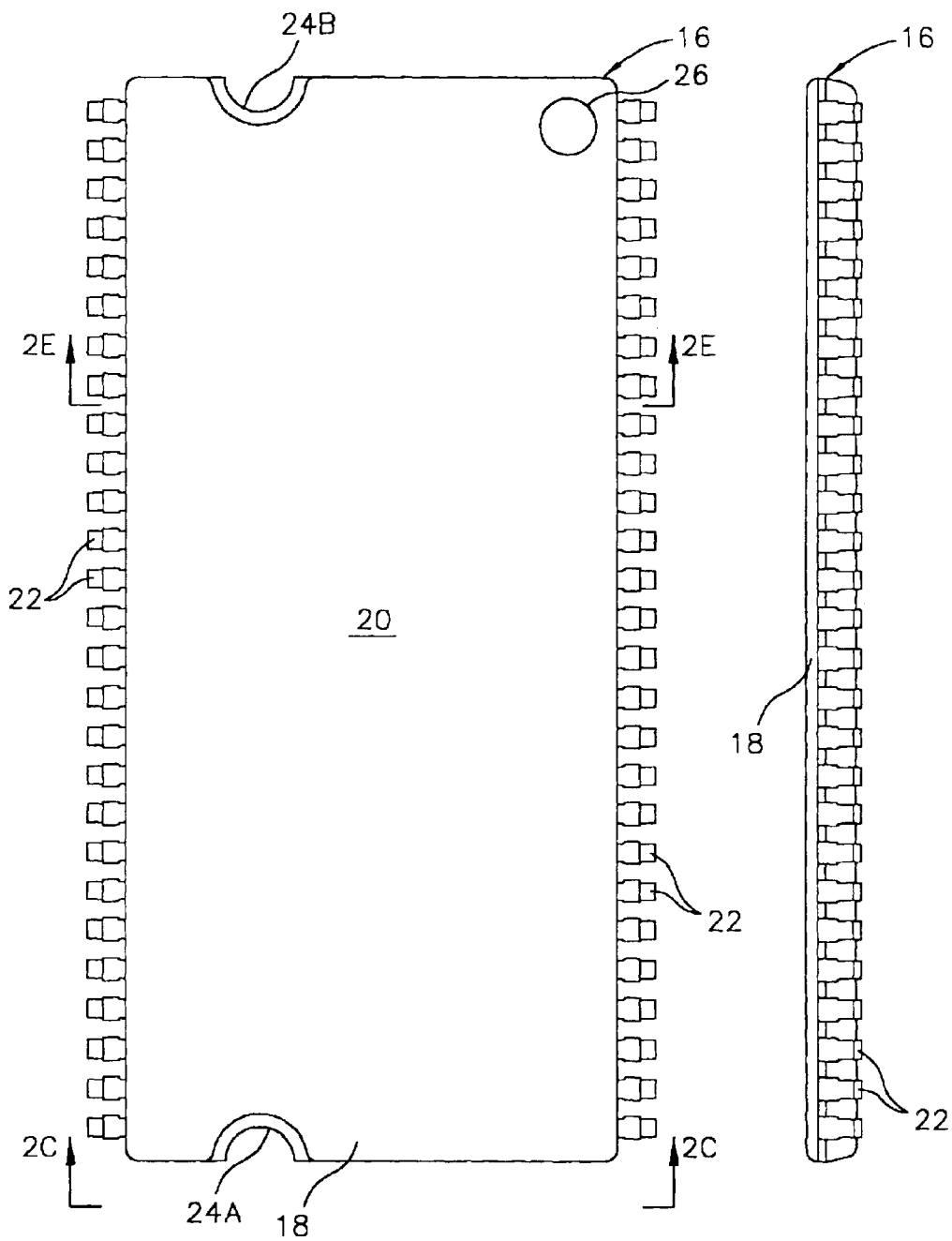
FIG. 2A is an enlarged plan view of a plastic semiconductor package constructed in accordance with the invention.
FIG. 2B is an enlarged side elevation view of the package.
Figure 2C:
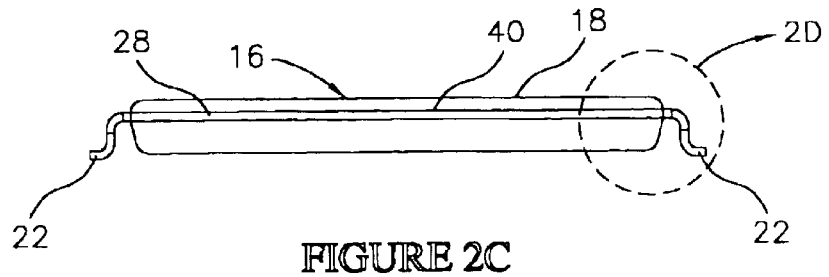
FIG. 2C is an enlarged end elevation view of the package taken along line 2C—2C of FIG. 2A.
Figure 2D:
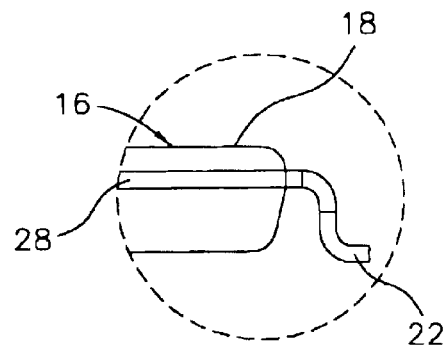
FIG. 2D is an enlarged view of a portion of FIG. 2C taken along line 2D of FIG. 2C illustrating a terminal lead on the package.

As shown in FIG. 2A, the package 16 includes a generally rectangular shaped plastic body 18 which comprises a molding compound molded into a required shape. The package 16 also includes a plurality of terminal leads 22 projecting from the plastic body 18 along opposed longitudinal edges thereof. As shown in FIG. 2D, the terminal leads 22 have a gull wing configuration to permit surface mounting to a supporting substrate, such as a circuit board or a multi chip module substrate. Alternately the terminal leads 22 can have other conventional configurations such as integral standoff, J-bend and butt joint. As also shown in FIG. 2A, the package includes notches 24A, 24B along opposed lateral edges of the plastic body 18, and a pin #1 indicator 26 on an upper surface 20 of the plastic body 18.

Figure 2E:
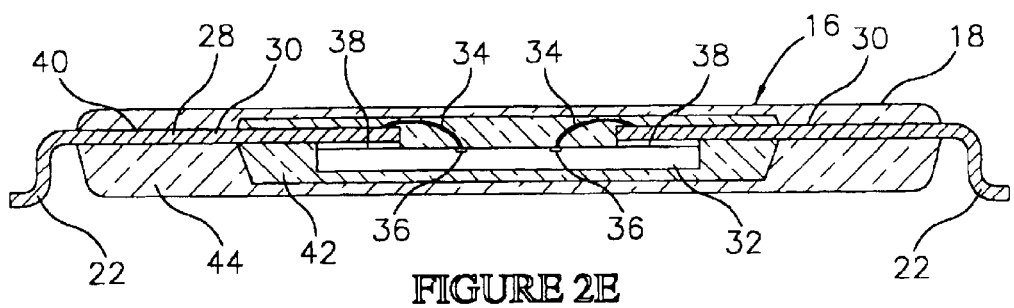
FIG. 2E is an enlarged cross sectional view of the package taken along section line 2E—2E of FIG. 2A.

As shown in FIG. 2E, the package 16 also includes a leadframe 28 encapsulated within the plastic body 18 using a molding process to be hereinafter described. In addition, the package 16 includes a semiconductor die 32 attached to the leadframe 28 and encapsulated within the plastic body 18.

A package parting line 40 is located at the interface of the upper surface of the leadframe 28 and the plastic body 18.

In the illustrative embodiment, the leadframe 28 and the die 32 have a LOC (lead-on-chip) configuration, such that lead fingers 30 of the leadframe 28 attach to the die 32 and form the terminal leads 22 for the package 16. Alternately, the leadframe 28 and the die 32 can have other conventional configurations. For example, the leadframe 28 can include a mounting paddle (not shown) for supporting the die 32.

Adhesive members 38 attach the face of the die 32 to the underside of the lead fingers 30. The adhesive members 38 can comprise LOC tape (e.g., polyimide tape coated with an adhesive), or can comprise an adhesive layer (e.g., polyimide) applied directly to the lead fingers 30. In addition, wire bonds 34 are formed between the lead fingers 30, and the bond pads 36 on the die 32. The bond pads 36 are in electrical communication with the integrated circuits contained on the die 32. The wire bonds 34 thus form separate electrical paths from the integrated circuits to the terminal leads 22.

As also shown in FIG. 2E, the plastic body 18 includes a molded inner member 42 that encapsulates the die 32 and a first portion of the leadframe 28 and the lead fingers 30. The plastic body 18 also includes a molded outer member 44 that encapsulates the inner member 42 and a second portion of the lead frame 28 and the lead fingers 30. The molded inner member 42 provides additional strength and rigidity for the package 16. In addition, the molded inner member 42 is configured to equalize the volume of molding compound contained in the molded outer member 44 above and below the leadframe 28 and the package parting line 40.

Figure 3A:
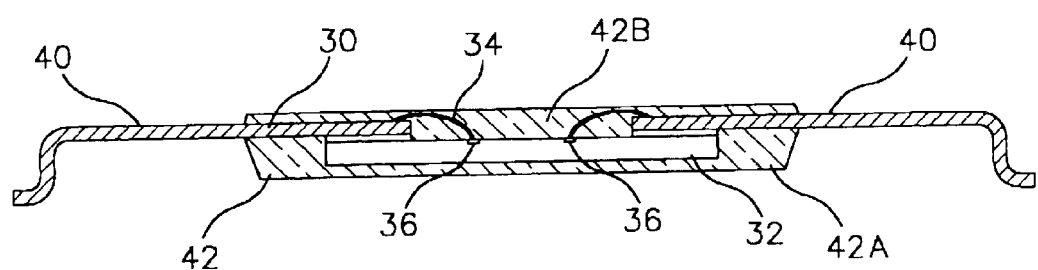
FIGS. 3A–3B are enlarged cross sectional view of the package with parts removed illustrating the molded inner member and the molded outer member of the package body.
Figure 3B:
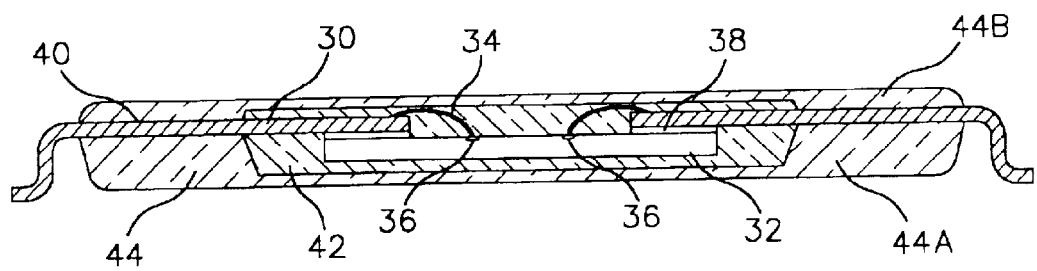

Referring to FIGS. 3A and 3B, further characteristics of the molded inner member 42, and the molded outer member 44 of the plastic body 18 are illustrated. As shown in FIG. 3A, the molded inner member 42 includes a lower portion 42A, and an upper portion 42B, separated from one another by the leadframe 28 and the die 32. The lower portion 42A of the molded inner member 42 encapsulates the die 32, and covers a lower portion of the lead fingers 30. The upper portion 42B of the molded inner member 42 encapsulates the wire bonds 34, and covers a face of the die 32. In addition, the upper portion 42B covers portions of the lead fingers 30 proximate to the die 32. During a molding process to be hereinafter described, a geometry of the molded inner member 42 is selected such that the molded outer member 44 (FIG. 3B) will have substantially equal volumes of molding compound above and below the package parting line 40.

As shown in FIG. 3B, the molded outer member 44 also includes a lower portion 44A and an upper portion 44B. The lower portion 44A of the molded outer member 44 encapsulates the lower portion 42A of the molded inner member 42, and covers a lower portion of the leadframe 28 proximate to the terminal leads 22 (FIG. 2E). The upper portion 44B of the molded outer member 44 encapsulates the upper portion 42B of the molded inner member 42 and covers an upper portion of the leadframe 28 proximate to the terminal leads 22 (FIG. 2E). Again the geometry of the molded outer member 44, and of the molded inner member 42, are selected such that the lower portion 44A, and the upper portion 44B of the molded outer member 44 comprise substantially equal volumes of molding compound.

The relationship of the volumes of lower portion 44A and upper portion 44B of the molded outer member 44 can be expressed mathematically as $V_{44A}=V_{44B}$. As is apparent, the relative volumes can be ascertained by consideration of the relevant geometries of the inner member 42, and the outer member 44 including thicknesses and areas. With this configuration for the package body 18, there are substantially equal volumes of molding compound in the molded outer member 44 on either side of the leadframe 28. In addition, there are substantially equal volumes of molding compound in the molded outer member 44 on either side of the package parting line 40. The equal volumes of molding compound help to minimize thermo mechanical stresses during cooling of the molding compound following molding of the outer member 44. With a reduction in the thermo mechanical stresses package bowing is also significantly reduced. In addition, the planarity of the lead fingers 30 and of the terminal leads 22 is improved.

Figure 4A:
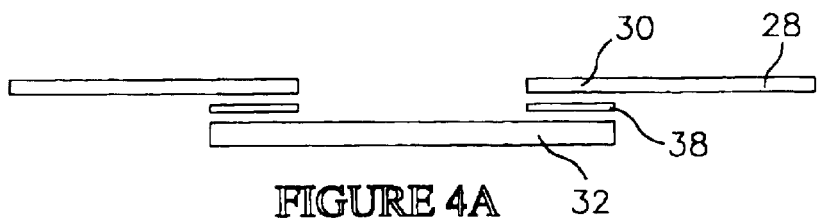
FIGS. 4A–4F are schematic cross sectional views illustrating steps in a method for fabricating the package in accordance with the method of the invention.

Referring to FIGS. 4A–4F, steps in a method for fabricating the semiconductor package 16 are illustrated. Initially, as shown in FIG. 4A, the leadframe 28, the adhesive members 38 and the semiconductor die 32 are provided.

Figure 4B:
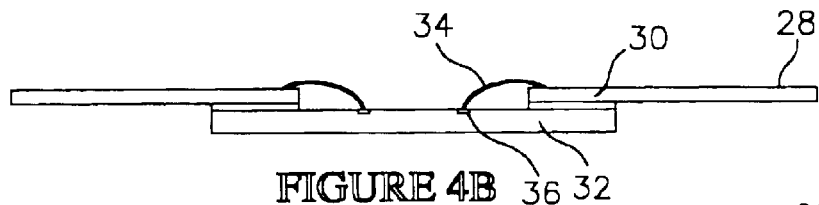

Next, as shown in FIG. 4B, the die 32 is attached to the lead fingers 30 of the leadframe 28 using the adhesive members 38. The die attach step can be performed using conventional die attach equipment and procedures. As also shown in FIG. 4B, the wire bonds 34 are formed between the die bond pads 36 and corresponding connection points on the lead fingers 30. Conventional wire bonding equipment can be used to form the wire bonds 34.

Figure 4C:
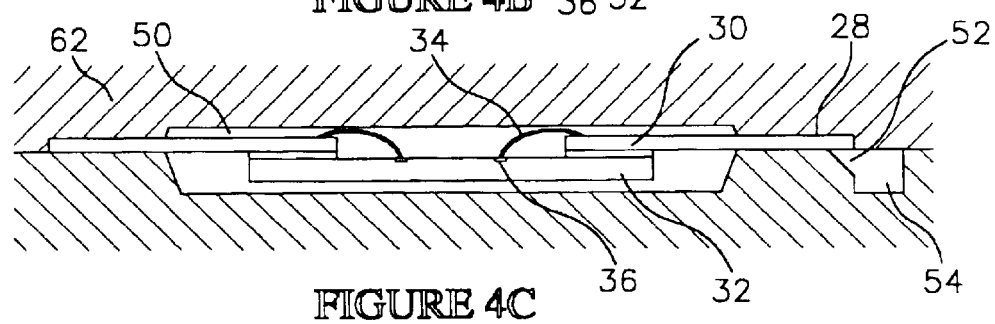

Next, as shown in FIG. 4C, a transfer molding press 62 that includes a first mold cavity 50 is provided. The transfer molding press 62 also includes a mold cavity gate 52 in flow communication with the first mold cavity 50, and a runner 54 in flow communication with a source of pressurized molding compound.

Using the transfer molding press 62 and the first mold cavity 50, the inner member 42 can be molded over the leadframe 28 and the die 32. The molding compound for the inner member 42 can comprise a conventional molding compound such as an epoxy resin in a B-stage condition. In addition, conventional parameters can be utilized for the molding process including conventional pressures and temperatures.

Figure 4D:
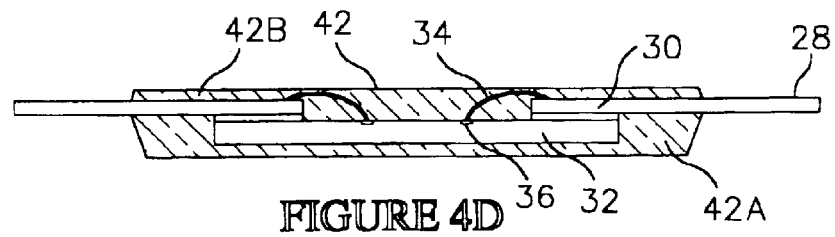

As shown in FIG. 4D, the inner member 42 encapsulates the die 32, and encapsulates lower portions of the lead fingers 30 proximate to the die 32. In addition, the inner member 42 encapsulates the wire bonds 34, and encapsulates upper portions of the lead fingers 30 proximate to the die 32.

The dimensions and the geometry of the first mold cavity 50 can be selected to form the inner member 42 with required dimensions and geometry, substantially as previously described. Specifically, the inner member 42 is formed such that the subsequently formed outer member 44 (FIG. 4F) will comprise substantially equal volumes of molding compound either side of the leadframe 28, and on either side of the package parting line 40 (FIG. 4F).

Prior to molding the outer member 44, the inner member 42 can be at least partially cured to provide an increased structural rigidity. For example, partial curing can be performed at a temperature of about 120° C.–180° C. for several minutes or more. In addition, the molding compound used to form the inner member 42 can include fillers selected to provide the outer member 44 with desired mechanical and electrical characteristics such as a relatively fast cure time, and an increased rigidity for strengthening the package body 18.

Figure 4E:
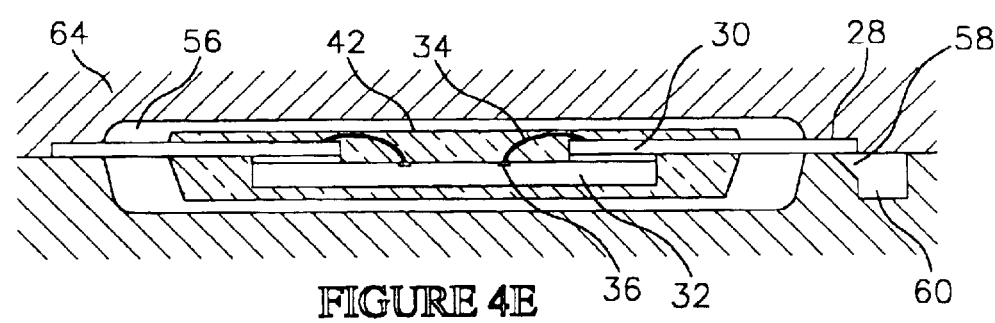
Figure 4F:
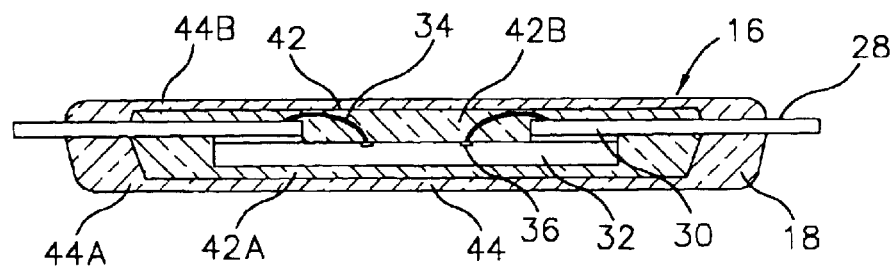

Next, as shown in FIG. 4E, a transfer molding press 64 that includes a second mold cavity 56 is provided. The second mold cavity 56 has dimensions and a geometry selected to form the outer member 44 with desired dimensions and geometrical configuration. The transfer molding press 64 also includes a mold cavity gate 58 in flow communication with the second mold cavity 56, and a runner 60 in flow communication with a source of pressurized molding compound.

Using the transfer molding press 64 and the second mold cavity 56, the outer member 44 can be molded over the leadframe 28 the inner member 42. As with the inner member 42, the outer member 44 can comprise a conventional molding compound such as an epoxy resin in a B-stage condition. In addition, conventional parameters for the molding process including pressures and temperatures can be utilized.

Figure 1A:
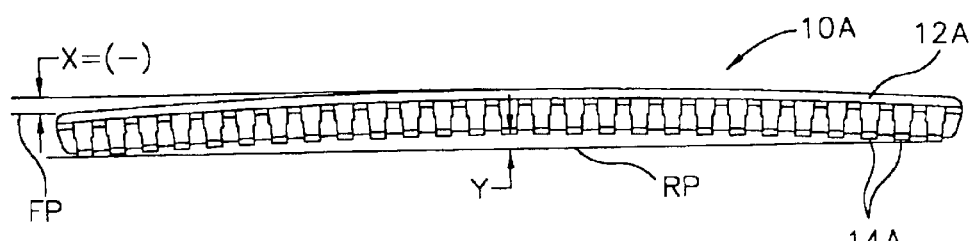
FIG. 1A is a schematic side elevation view of a prior art plastic semiconductor package having a negative bow.
Figure 1B:
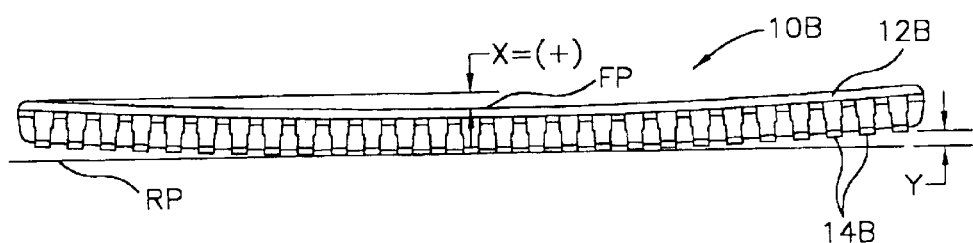
FIG. 1B is a schematic side elevation view of a prior art plastic semiconductor package having a positive bow.
Figure 1C:
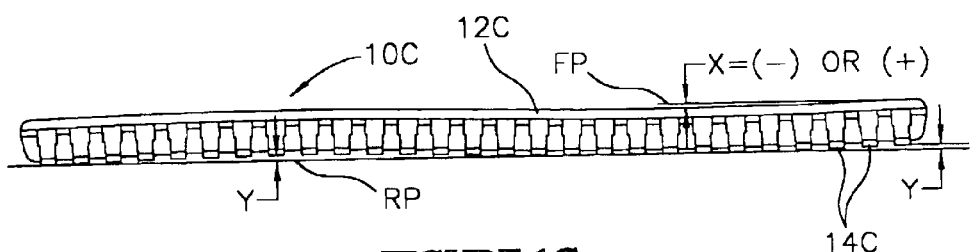
FIG. 1C is a schematic side elevation view of a plastic semiconductor package having multiple bows.

As shown in FIG. 4F, the molded package body 18 includes the molded inner member 42, and the molded outer member 44. A volume of the lower portion 44A of the molded outer member 44 is substantially equal to a volume of the upper portion 44B of the molded outer member 44. During cooling of the molded outer member 44, thermo mechanical stresses are less likely to be generated due to these substantially equal volumes. In addition, a magnitude of the thermal mechanical stresses that do develop is less, such that micro cracks are less likely to occur in the structure of the package body 18. Further, a planarity of the terminal leads 22A can be maintained such that the offset Y (FIG. 1A) between any lead 22, and a theoretical reference plane RF (FIG. 1A) can be less than about 3 mils (0.003 inches=0.075 mm). Still further, a package bow X (FIG. 1A) measured from a theoretical flat profile FP (FIG. 1A) can also be less than about 3 mils (0.003 inches=0.075 mm).

Figure 5:
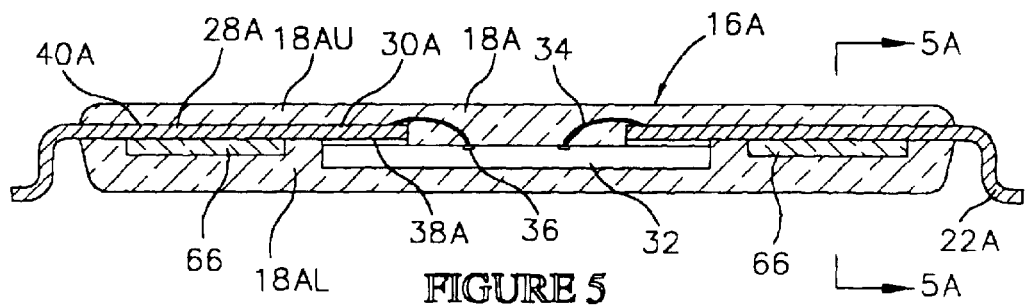
FIG. 5 is an enlarged cross sectional view, equivalent to FIG. 2E of an alternate embodiment semiconductor package having volume equalizing members.
Figure 5A:
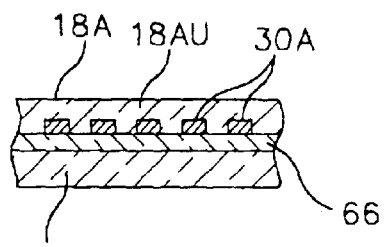
FIG. 5A is an enlarged cross sectional view taken along section line 5A—5A of FIG. 5 illustrating a volume equalizing member.

Referring to FIGS. 5 and 5A, an alternate embodiment package 16A is illustrated. The package 16A includes a semiconductor die 32 and a leadframe 28A having lead fingers 30A substantially as previously described. The package 16A also includes adhesive members 38A for attaching the die 32 to the lead fingers 30A, and wire bonds 34A formed between the die 32 and the lead fingers 30A. In addition, the package 16A includes a package body 18A, and a plurality of terminal leads 22A extending from the package body 18A.

The package 16A also includes one or more volume equalizing members 66 formed on the leadframe 28A. The volume equalizing members 66 have a volume (length× width×depth) selected to equalize a molding compound volume of a lower portion 18AL of the package body 18A, relative to a molding compound volume of an upper portion 18AU of the package body 18A. Accordingly, there is a substantially equal volume of molding compound on either side of the leadframe 28A, and substantially equal volumes above and below a parting line 40A of the package 16A. As previously explained, the substantially equal volumes help to minimize thermo mechanical stresses during molding and curing of the package body 18A.

In the illustrative embodiment, the volume equalizing members 66 have a generally rectangular cross section. Alternately, the volume equalizing members 66 can have other cross sections (e.g., circular, oval, triangular). As shown in FIG. 5A, the volume equalizing members 66 extend across the lower surfaces of the lead fingers 30A of the leadframe 28A.

The volume equalizing members 66 can comprise molded members formed by a molding compound substantially as previously described for inner member 42 (FIG. 2E). In addition, the package body 18A can be formed on the leadframe 28A, die 32 and volume equalizing members 66 using a molding compound and a transfer molding process substantially as previously described for package body 18 (FIG. 2E).

Alternately, the volume equalizing members 66 can comprise an electrically-insulating, deposited and cured polymer material such as an epoxy, silicone, room temperature vulcanizing (RTV) or polyimide material. Suitable compounds are commercially available from Dexter-Hysol and from Thermoset. One method for depositing such a polymer material is by dispensing from a nozzle or a needle, in the manner of a "glob top" encapsulant.

As another alternative, the volume equalizing members 66 can comprise a tape material such as a polyimide tape coated on one or both sides with a thermosetting or thermoplastic adhesive. Such a tape can be a commercial tape similar to die attach tape manufactured by Sumitomo Metal & Mining, and Hitachi Chemical Co., Ltd.

Figure 6:
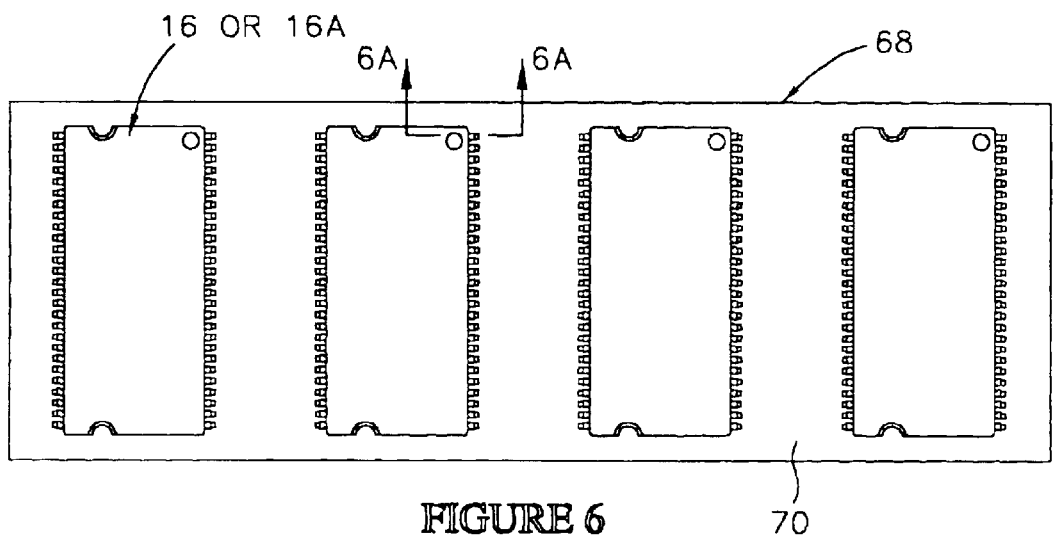
FIG. 6 is a plan view of an electronic assembly constructed using a plastic package constructed in accordance with the invention.
Figure 6A:
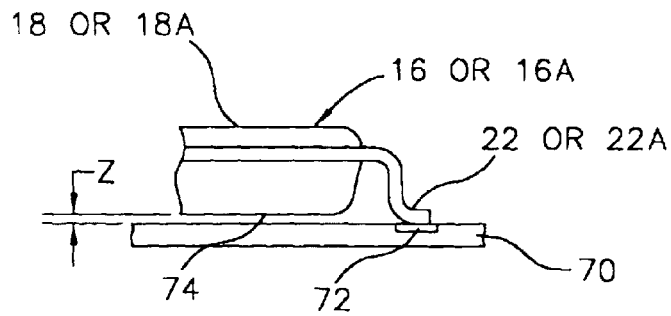
FIG. 6A is an enlarged cross sectional view taken along section line 6A—6A of FIG. 6 illustrating bonded connections between terminal leads of the package and electrodes on a supporting substrate.

Referring to FIGS. 6 and 6A, an electronic assembly 68 fabricated using semiconductor packages 16 or 16A, constructed in accordance with the invention is illustrated. The electronic assembly 68 can be configured as a printed circuit board, a multi chip module, or a sub assembly of electronic product such as a field emission display. The electronic assembly includes a supporting substrate 70 and a plurality of packages 16 or 16A, surface mounted to the supporting substrate 70. Depending on the application, the supporting substrate 70 can comprise a ceramic, plastic or printed circuit board material (e.g., FR-4).

The terminal leads 22 or 22A, of the package 16 or 16A, are bonded to corresponding electrodes 72 (FIG. 6A) on the supporting substrate 70, using a suitable bonding process such as soldering, or curing of a conductive polymer. Because the terminal leads 22 or 22A are substantially co-planar, stress loads between the terminal leads 22 or 22A, and the electrodes 72 are substantially reduced. In addition, an offset Z between the lower surface 74 of the package 16 or 16A, and the supporting substrate 70 can be accurately maintained without generating stress loads.

Thus the invention provides an improved bow resistant plastic semiconductor package, and a method for fabricating plastic semiconductor packages with reduced package bow. In addition, the package can be used to fabricate improved electronic assemblies such as multi chip modules without stressing bonded connections to a supporting substrate.

While the invention has been described with reference to certain preferred embodiments, as will be apparent to those skilled in the art, certain changes and modifications can be made without departing from the scope of the invention as defined by the following claims.

What is claimed is:

1. A semiconductor package comprising:
    a leadframe;
    a die on the leadframe; and
    a plastic body comprising a first member comprising a first compound encapsulating the die and a portion of the leadframe, and a second member comprising a second compound encapsulating the first member;
    the first member and the second member having geometries selected to reduce thermo-mechanical stresses in the package,
    the first compound and the second compound having at least one filler selected to provide desired mechanical and electrical characteristics in the package;

wherein a package bow measured from a theoretical flat profile FP is less than about 3 mils.

2. The semiconductor package of claim 1 wherein the first member has a geometry selected to equalize volumes of the second compound on either side of the leadframe.

3. The semiconductor package of claim 2 wherein the first member and the second member comprise an epoxy.

4. The semiconductor package of claim 1 wherein the first member comprises a first filler.

5. The semiconductor package of claim 1 wherein the first member includes a filler selected to increase a strength of the package.

6. The semiconductor package of claim 1 wherein the die includes wire bonds and the first member encapsulates the wire bonds.

7. A semiconductor package comprising:

a leadframe;

a die on the leadframe;

a first member encapsulating the die and at least a portion of the leadframe; and a second member encapsulating the first member having substantially equal volumes of a molding compound on either side of the leadframe;

the first member having a selected geometry for providing the substantially equal volumes and for reducing thermo-mechanical stresses during molding of the second polymer member;

wherein the first member is configured to reduce a package bow measured from a theoretical flat profile FP to less than about 3 mils.

8. The semiconductor package of claim 7 wherein the first member and the second member comprise epoxy.

9. The semiconductor package of claim 7 wherein the first member includes a filler configured to increase a rigidity of the first member.

10. The semiconductor package of claim 7 wherein the first member includes a filler.

11. The semiconductor package of claim 7 wherein the first member and the second member comprise an epoxy.

12. A semiconductor package comprising:

a leadframe having a first side and a second side;

a die on the leadframe;

a plastic body comprising a molding compound encapsulating the die and at least a portion of the leadframe, the plastic body having a first portion on the first side having a first volume and a second portion on the second side having a second volume;

a polymer member on the leadframe having a selected geometry configured to equalize the first volume and the second volume and to reduce a package bow measured from a theoretical flat profile FP to less than about 3 mils.

13. The semiconductor package of claim 12 wherein the polymer member comprises a molding compound.

14. The semiconductor package of claim 12 wherein the polymer member comprises a tape material.

15. The semiconductor package of claim 12 wherein the polymer member comprises a molding compound and a filler.

16. The semiconductor package of claim 12 further comprising a plurality of polymer members located on opposing sides of the die.

17. The semiconductor package of claim 12 wherein the polymer member comprises a molded member.

18. The semiconductor package of claim 12 wherein the polymer member comprises an electrically insulating cured material.

19. A semiconductor package comprising:

a leadframe;

a die on the leadframe;

a first member encapsulating the die and a portion of the leadframe comprising a first molding compound; and a second member encapsulating the first member comprising a second molding compound on either side of the leadframe;

the first member and the second member having a geometry selected to reduce thermo-mechanical stresses in the package and to provide a package bow measured from a theoretical flat profile FP of less than about 3 mils.

20. The semiconductor package of claim 19 wherein the first molding compound and the second molding compound comprise an epoxy.

21. The semiconductor package of claim 19 wherein the second member comprises substantially equal volumes of the second molding compound on either side of the leadframe.

22. The semiconductor package of claim 19 wherein the first member includes at least one filler.

23. The semiconductor package of claim 19 wherein the first member comprises epoxy and a filler.

* * * * *